(12) United States Patent
Besser et al.

(10) Patent No.: US 6,614,064 B1
(45) Date of Patent: Sep. 2, 2003

(54) TRANSISTOR HAVING A GATE STICK COMPRISED OF A METAL, AND A METHOD OF MAKING SAME

(75) Inventors: Paul R. Besser, Sunnyvale, CA (US); William S. Brennan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/060,422

(22) Filed: Jan. 30, 2002

(51) Int. Cl.[7] .............................................. H01L 29/72
(52) U.S. Cl. .................. 257/213; 257/296; 257/415; 257/420; 257/618
(58) Field of Search ................................ 257/618, 213, 257/296, 415, 420

(56) References Cited

U.S. PATENT DOCUMENTS

2001/0026004 A1 * 10/2001 Kwok et al. ................ 257/618

* cited by examiner

*Primary Examiner*—Edward Wojciechowicz
(74) *Attorney, Agent, or Firm*—Williams, Morgan & Amerson, P.C.

(57) ABSTRACT

The present invention is generally directed to a transistor having a gate stack comprised of a metal, and a method of making same. In one illustrative embodiment, the transistor is comprised of a gate stack comprised of a gate insulation layer positioned above a semiconducting substrate, a layer of silicon positioned above the gate insulation layer, a layer of adhesion material positioned above the layer of silicon, a layer of metal positioned above the layer of adhesion material, and a plurality of source/drain regions formed in the substrate adjacent the gate stack.

20 Claims, 2 Drawing Sheets

US 6,614,064 B1

TRANSISTOR HAVING A GATE STICK COMPRISED OF A METAL, AND A METHOD OF MAKING SAME

BACKGROUND OF THE INVENTION

1. Field of the Invention

The present invention is generally directed to the field of semiconductor manufacturing, and, more particularly, to a transistor having a gate stack comprised of a metal, and a method of making same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

In attempting to improve the performance of integrated circuit devices, one area of potential improvement involves using a metal as a gate electrode material. Many modern integrated circuit devices are comprised of transistors having polysilicon gate electrodes. However, due to the decreased resistance of a metal as compared to polysilicon, metal is an attractive option for the gate electrodes of transistors to increase the overall operating speed of the transistor device.

A transistor 10 having an illustrative gate stack 11 comprised of a metal is shown in FIGS. 1A–1B. As shown therein, the transistor 10 is formed in an active region 14 of a semiconducting substrate 12 as defined by isolation structures 16. The transistor 10 is comprised of the gate stack 11, sidewall spacers 20 and a plurality of source/drain regions 18. With further reference to FIG. 1A, the gate stack 11 is comprised of a gate insulation layer 22, a layer of titanium nitride 24, and a layer of metal 26. The gate insulation layer 22 is comprised of silicon dioxide, and it has a thickness of approximately 1–5 nm. The titanium nitride layer 24 has a thickness of approximately 15 nm, and the metal layer 26 is comprised of tungsten and it has a thickness of approximately 50 nm. The gate insulation layer 22 is typically formed by a thermal oxidation process. The titanium nitride layer 24 and the metal layer 26 are typically formed by a physical vapor deposition process. During fabrication, additional process layers may be formed above the metal layer 26. For example, a silicon nitride anti-reflective coating (ARC) layer (not shown) may be formed above the metal layer 26, and a silicon nitride cap layer (not shown) may be formed above the ARC layer.

Although the gate stack 11 structure depicted in FIGS. 1A–1B does exhibit lower resistance due to the presence of the metal layers 24, 26, the work-function of the resulting transistor is not as desirable as that of a polysilicon gate. In general, the work-function is a primary parameter that determines the threshold voltage between the gate electrode material and the doping level in the substrate. In a sense, the work-function can be thought of as a kind of electrical compatibility. The lower the work-function, the lower the threshold voltage, the lower the power required to run the circuit, etc. All other things being equal, it would be desirable to reduce the work-function of the gate stack 11. Moreover, in the configuration depicted in FIGS. 1A–1B, the presence of the titanium nitride layer 24 tends to create undesirable mid-gap states in the gate insulating layer 22. Such mid-gap states tend to cause increased leakage currents in the completed transistor.

The present invention is directed to a method that may solve, or at least reduce, some or all of the aforementioned problems.

SUMMARY OF THE INVENTION

The present invention is generally directed to a transistor having a gate stack comprised of a metal, and a method of making same. In one illustrative embodiment, the transistor is comprised of a gate stack comprised of a gate insulation layer positioned above a semiconducting substrate, a layer of silicon positioned above the gate insulation layer, a layer of adhesion material positioned above the layer of silicon, a layer of metal positioned above the layer of adhesion material, and a plurality of source/drain regions formed in the substrate adjacent the gate stack. In further illustrative embodiments, the gate stack is comprised of a gate insulation layer, the layer of silicon is implanted with dopant atoms, the adhesion layer is comprised of titanium nitride, and the metal layer is comprised of tungsten.

BRIEF DESCRIPTION OF THE DRAWINGS

The invention may be understood by reference to the following description taken in conjunction with the accompanying drawings, in which like reference numerals identify like elements, and in which.

Figure 1A:
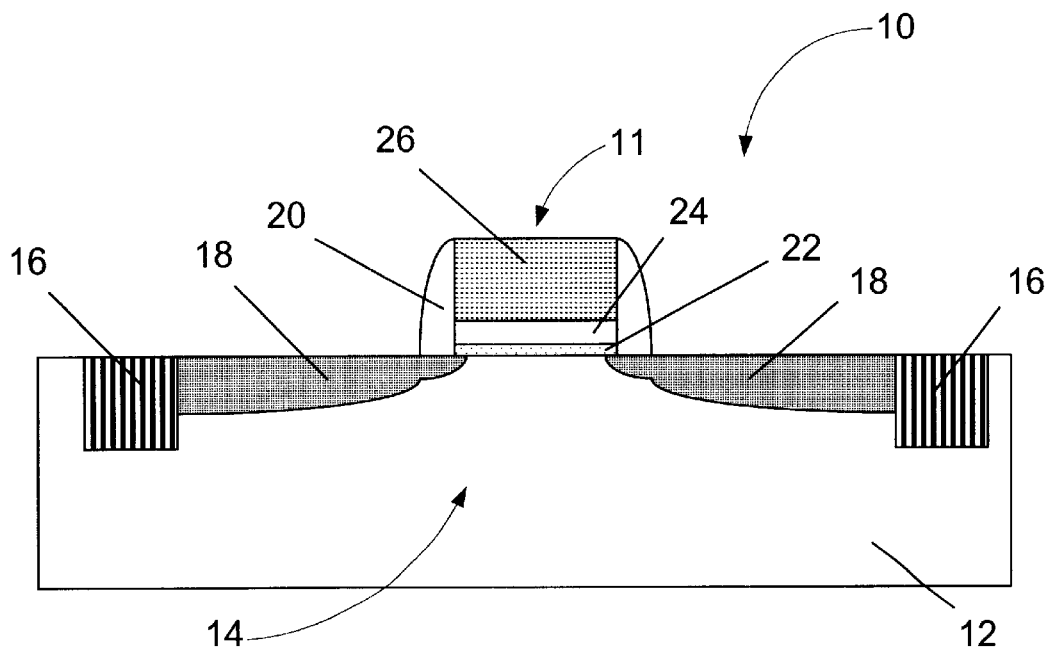
FIGS. 1A–1B are cross-sectional views of an illustrative prior art gate stack comprised of a metal.
Figure 1B:
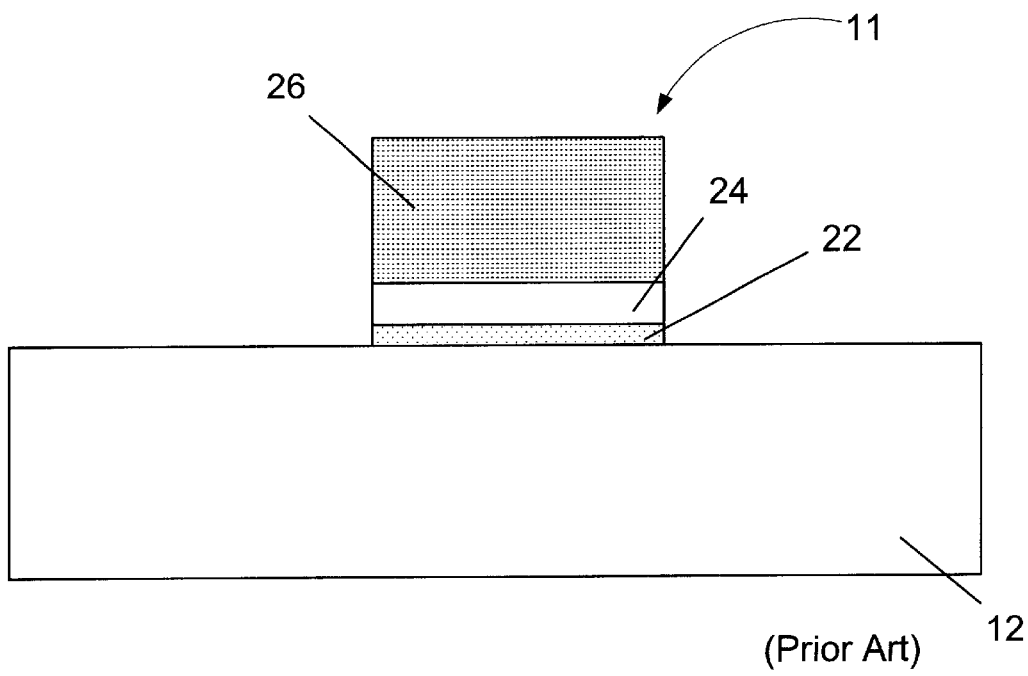

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a transistor having a gate stack comprised of a metal, and a method of making same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2A:
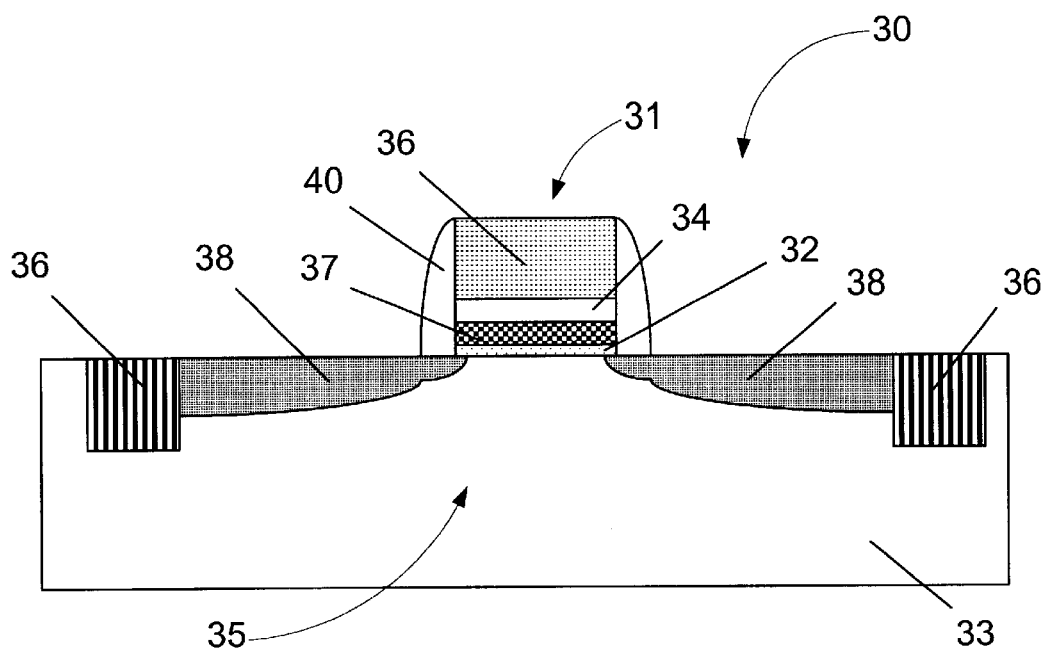
FIGS. 2A–2B depict an illustrative example of a transistor with a gate stack in accordance with one illustrative embodiment of the present invention.
Figure 2B:
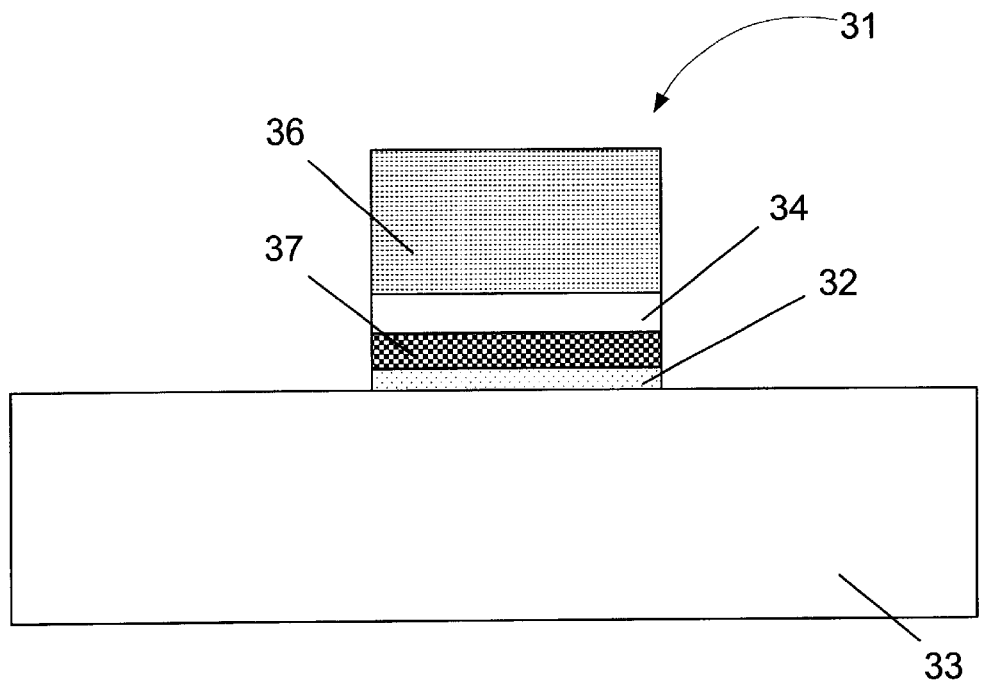

FIGS. 2A–2B depict a transistor 30 in accordance with one illustrative embodiment of the present invention. As shown therein, the transistor 30 is comprised of a gate stack 31, sidewall spacers 40, and a plurality of source/drain regions 38. As further shown in FIG. 2B, the gate stack 31 is comprised of a gate insulation layer 32, a layer of silicon 37, an adhesion layer 34, and a layer of metal 36.

The gate insulation layer 32 may be comprised of a variety of materials, and it may be formed by a variety of techniques. For example, the gate insulation layer 32 may be comprised of silicon dioxide, silicon oxynitride, or other insulating materials, i.e., so-called "low-k" dielectric materials. In one illustrative embodiment, the gate insulation layer 32 is comprised of a thermally grown layer of silicon dioxide having a thickness ranging from approximately 1–10 nm.

The layer of silicon 37 may be formed by a variety of techniques, e.g., chemical vapor deposition ("CVD"), physical vapor deposition ("PVD"), atomic layer deposition ("ALD"), etc., and it may have a thickness ranging from approximately 5–20 nm. In some situations, it is common to use a small amount of boron or arsenic in the silicon target to enhance PVD sputtering of the layer of silicon 37. For example, approximately 5–15 ppb of boron may be added to the silicon target. Moreover, dopant materials may be introduced into the layer of silicon 37 such that the layer of silicon 37 has a concentration of dopant materials ranging from approximately $10^{17}$–$10^{21}$ ions/cm$^3$. The layer of silicon 37 may be doped with N-type dopant materials, e.g., arsenic, phosphorous, for NMOS type devices, and it may be doped with P-type dopant materials, e.g., boron, boron difluoride, for PMOS type devices.

Dopant atoms may be introduced into the layer of silicon 37 in at least two different ways. In one embodiment, dopant atoms are implanted into the layer of silicon 37 after it is originally formed. In this embodiment, for an illustrative NMOS device, arsenic may be implanted into the layer of silicon material at a dopant concentration ranging from approximately $10^{17}$–$10^{21}$ ions/cm$^2$ and at an energy level ranging from approximately 10–30 keV. Alternatively, dopant atoms may be introduced into the layer of silicon material during the process of forming the silicon layer 37. That is, dopant material may be introduced into the deposition chamber during the process of forming the layer of silicon material.

Next, the adhesion layer 34 is formed above the silicon layer 37. The adhesion layer 34 may also serve as an etch stop layer when the gate stack 31 is patterned. The adhesion layer 34 may be comprised of a variety of materials, e.g., titanium nitride, titanium tungsten, etc. Moreover, the adhesion layer 34 may be formed by a PVD or CVD process, and it may have a thickness ranging from approximately 12.5–17.5 nm. In one illustrative embodiment, the adhesion layer 34 is comprised of titanium nitride layer having a thickness of approximately 15 nm, and it may be formed by a PVD process.

Thereafter, the metal layer 36 may be formed. The metal layer 36 may be comprised of a variety of materials, e.g., tungsten, tungsten silicide, molybdenum silicide, etc., and it may be formed by a variety of processes, e.g., PVD, CVD, ALD, etc. In one illustrative embodiment, the metal layer 36 is comprised of a layer of tungsten having a thickness ranging from approximately 40–60 nm that is formed by a PVD process.

Thereafter, additional layers may be formed above the metal layer 36 if desired or warranted by process considerations. For example, an ARC layer comprised of silicon nitride (not shown) may be formed above the metal layer 36, and a silicon nitride cap layer (not shown) may be formed above the ARC layer. Thereafter, using known photolithographic and etching techniques, the gate stack 31 may be patterned. Additional processing operations may be performed to form the source/drain regions and the sidewall spacers.

The present invention is generally directed to a transistor having a gate stack comprised of a metal, and a method of making same. In one illustrative embodiment, the transistor 30 is comprised of a gate stack 31 comprised of a gate insulation layer 32 positioned above a semiconducting substrate 33, a layer of silicon 37 positioned above the gate insulation layer 32, a layer of adhesion material 34 positioned above the layer of silicon 37, a layer of metal 36 positioned above the layer of adhesion material 34, and a plurality of source/drain regions 38 formed in the substrate 33 adjacent the gate stack 31. In further embodiments, the layer of metal 36 is comprised of tungsten, the layer of adhesion material 34 is comprised of titanium nitride, and the layer of silicon 37 contains dopant atoms at a concentration of approximately $10^{14}$–$10^{21}$ ions/cm$^3$.

In one illustrative embodiment, the method disclosed herein comprises forming a gate insulation layer 32 above a semiconducting substrate 33, forming a layer of silicon 37 above the gate insulation layer 32, and forming a layer of adhesion material 34 above the layer of silicon 37. The method further comprises forming a layer of metal 36 above the adhesion layer 34, patterning at least the layer of metal 36, the layer of adhesion material 34 and the layer of silicon 37 to define a gate stack 31, and forming a plurality of source/drain regions 38 in the substrate 33 adjacent the gate stack 31. In a further embodiment, the method involves introducing dopant atoms into the layer of silicon 37 by an ion implantation process.

Through use of the present invention, integrated circuit devices with higher performance capabilities may be manufactured. That is, through use of the present invention, transistors may be formed that have reduced gate resistance and a lower work-function as compared to comparable transistors. This reduced resistance and work-function will result in integrated circuit devices having increased performance capabilities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor, comprising:
    a gate stack comprised of:
        a gate insulation layer positioned above a semiconducting substrate;
        a layer of silicon positioned above said gate insulation layer, wherein said layer of silicon is comprised of dopant atoms at a concentration ranging from approximately $10^{17}$–$10^{21}$ ions/cm$^3$;
        a layer of adhesion material positioned above said layer of silicon;
        a layer of metal positioned above said layer of adhesion material;
    a plurality of source/drain regions formed in said substrate adjacent said gate stack; and
    a plurality of sidewall spacers positioned adjacent said gate stack.

2. The transistor of claim 1, wherein said gate insulation layer is comprised of at least one of silicon dioxide and silicon oxynitride.

3. The transistor of claim 1, wherein said gate insulation layer is comprised of a layer of silicon dioxide having a thickness ranging from approximately 1–10 nm.

4. The transistor of claim 1, wherein said layer of silicon has a thickness ranging from approximately 5–20 nm.

5. The transistor of claim 1, wherein said dopant atoms in said layer of silicon is comprised of at least one of arsenic, phosphorous, boron and boron difluoride at a concentration ranging from approximately $10^{17}$–$10^{21}$ ions/cm$^3$.

6. The transistor of claim 1, wherein said layer of adhesion material is comprised of at least one of titanium nitride and titanium tungsten.

7. The transistor of claim 1, wherein said layer of adhesion material has a thickness ranging from approximately 12.5–17.5 nm.

8. The transistor of claim 1, wherein said layer of adhesion material is comprised of titanium nitride and it has a thickness of approximately 12.5–17.5 nm.

9. The transistor of claim 1, wherein said layer of metal is comprised of at least one of tungsten, tungsten silicide and molybdenum silicide.

10. The transistor of claim 1, wherein said layer of metal has a thickness of approximately 40–60 nm.

11. The transistor of claim 1, wherein said layer of metal is comprised of tungsten and it has a thickness of approximately 40–60 nm.

12. A transistor, comprising:
    a gate stack comprised of:
        a gate insulation layer positioned above a semiconducting substrate;
        a layer of silicon positioned above said gate insulation layer, wherein said layer of silicon is comprised of dopant atoms at a concentration ranging from approximately $10^{17}$–$10^{21}$ ions/cm$^3$;
        a layer of adhesion material comprised of at least one titanium nitride and titanium tungsten positioned above said layer of silicon;
        a layer of metal comprised of tungsten positioned above said layer of adhesion material;
    a plurality of source/drain regions formed in said substrate adjacent said gate stack; and
    a plurality of sidewall spacers positioned adjacent said gate stack.

13. The transistor of claim 12, wherein said gate insulation layer is comprised of at least one of silicon dioxide and silicon oxynitride.

14. The transistor of claim 12, wherein said gate insulation layer is comprised of a layer of silicon dioxide having a thickness ranging from approximately 1–10 nm.

15. The transistor of claim 12, wherein said layer of silicon has a thickness ranging from approximately 5–20 nm.

16. The transistor of claim 12, wherein said dopant atoms in said layer of silicon is comprised of at least one of arsenic, phosphorous, boron and boron difluoride at a concentration ranging from approximately $10^{17}$–$10^{21}$ ions/cm$^3$.

17. The transistor of claim 12, wherein said layer of adhesion material has a thickness ranging from approximately 12.5–17.5 nm.

18. The transistor of claim 12, wherein said layer of adhesion material is comprised of titanium nitride and it has a thickness of approximately 12.5–17.5 nm.

19. The transistor of claim 12, wherein said layer of metal has a thickness of approximately 40–60 nm.

20. A transistor, comprising:
    a gate stack comprised of:
        a gate insulation layer comprised of silicon dioxide positioned above a semiconducting substrate, wherein said gate insulation layer has a thickness ranging from approximately 1–10 nm;
        a layer of silicon having a thickness ranging from approximately 5–20 nm positioned above said gate insulation layer, wherein said layer of silicon is comprised of at least one of arsenic, phosphorous, boron and boron difluoride at a concentration ranging from approximately $10^{17}$–$10^{21}$ ions/cm$^3$;
        a layer of titanium nitride positioned above said layer of silicon, wherein said layer of titanium nitride has a thickness ranging from approximately 12.5–17.5 nm;
        a layer of tungsten positioned above said layer of titanium nitride, wherein said layer of tungsten has a thickness of approximately 40–60 nm;
    a plurality of source/drain regions formed in said substrate adjacent said gate stack; and
    a plurality of sidewall spacers positioned adjacent said gate stack.

* * * * *

UNITED STATES PATENT AND TRADEMARK OFFICE
CERTIFICATE OF CORRECTION

PATENT NO. : 6,614,064 B1
DATED : September 2, 2003
INVENTOR(S) : Paul R. Besser and William S. Brennan It is certified that error appears in the above-identified patent and that said Letters Patent is hereby corrected as shown below:

Title page,
Item [54], the title should be as follows: "TRANSISTOR HAVING A GATE STACK COMPRISED OF A METAL, AND A METHOD OF MAKING SAME"

Signed and Sealed this

Second Day of December, 2003

JAMES E. ROGAN
*Director of the United States Patent and Trademark Office*